(12) United States Patent
Wang et al.

(10) Patent No.: US 9,298,034 B1
(45) Date of Patent: Mar. 29, 2016

(54) LIQUID CRYSTAL DISPLAY DEVICE AND METHOD FOR MANUFACTURING THE SAME

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Hui Wang, Beijing (CN); Yuanhui Guo, Beijing (CN); Chun Wang, Beijing (CN); Junsheng Chen, Beijing (CN); Xiaohe Li, Beijing (CN); Chuncheng Che, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/744,225

(22) Filed: Jun. 19, 2015

(30) Foreign Application Priority Data

Feb. 16, 2015  (CN) .......................... 2015 1 0085533

(51) Int. Cl.
*H01L 27/14*  (2006.01)
*H01L 29/04*  (2006.01)
*H01L 29/15*  (2006.01)
*H01L 31/036*  (2006.01)
(Continued)

(52) U.S. Cl.
CPC .... *G02F 1/133514* (2013.01); *G02F 1/133512* (2013.01); *G02F 1/133516* (2013.01);
(Continued)

(58) Field of Classification Search
CPC ..... H01L 22/12; H01L 27/1296; H01L 22/30; H01L 27/1218; G02F 1/133509; G02F 1/133514; G02F 1/133528
See application file for complete search history.

(56) References Cited

U.S. PATENT DOCUMENTS

| | | | | |
|---|---|---|---|---|
| 7,068,339 B2* | 6/2006 | Nakamura | ............ | G02F 1/1339 349/152 |
| 7,411,643 B2* | 8/2008 | Wu | ........................ | G02F 1/1339 349/110 |
| 2001/0030728 A1* | 10/2001 | Takasugi | ............... | G02F 1/1345 349/149 |

*Primary Examiner* — Thanh Y Tran
(74) *Attorney, Agent, or Firm* — Kinney & Lange, P.A.

(57) ABSTRACT

Embodiments of the present disclosure relate to the field of display technology, and particularly, to a liquid crystal display device and a method for manufacturing the same, which effectively improve accuracy and effectiveness of checking affixation of the polarizing sheets. The liquid crystal display device comprises a color filter substrate, an array substrate, an upper polarizing sheet and a lower polarizing sheet. The color filter substrate comprises a first graduated scale and a second graduated scale, the array substrate comprises a third graduated scale and a fourth graduated scale, and the first graduated scale, the second graduated scale, the third graduated scale and the fourth graduated scale are arranged within a non-display region. The first graduated scale is used to measure a distance of at least one first edge of first edges parallel with each other of the upper polarizing sheet to an edge of the color filter substrate closer to the at least one first edge; and the second graduated scale is used to measure a distance of at least one second edge of second edges parallel with each other of the upper polarizing sheet to an edge of the color filter substrate closer to the at least one second edge; and the third graduated scale is used to measure a distance of at least one third edge of third edges parallel with each other of the lower polarizing sheet to an edge of the array substrate closer to the at least one third edge; and, the fourth graduated scale is used to measure a distance of at least one fourth edge of fourth edges parallel with each other of the lower polarizing sheet to an edge of the array substrate closer to the at least one fourth edge.

18 Claims, 5 Drawing Sheets

(51) Int. Cl.
*G02F 1/1335* (2006.01)
*H01L 21/66* (2006.01)
*H01L 27/12* (2006.01)
*G02F 1/1333* (2006.01)

(52) U.S. Cl.
CPC .......... *G02F1/133528* (2013.01); *H01L 22/12* (2013.01); *H01L 22/30* (2013.01); *H01L 27/1218* (2013.01); *H01L 27/1296* (2013.01); *G02F 2001/133354* (2013.01)

LIQUID CRYSTAL DISPLAY DEVICE AND METHOD FOR MANUFACTURING THE SAME

CROSS-REFERENCE TO RELATED APPLICATION

This application claims the benefit of Chinese Patent Application No. 201510085533.9 filed on Feb. 16, 2015 in the State Intellectual Property Office of China, the whole disclosure of which is incorporated herein by reference.

BACKGROUND OF THE DISCLOSURE

1. Technical Field

The present disclosure relates to the field of display technology, and particularly, to a liquid crystal display device and a method for manufacturing the same.

2. Description of the Related Art

A liquid crystal display comprises a display panel and upper and lower polarizing sheets. The display panel comprises an array substrate, a color filter substrate and a liquid crystal layer located between the array substrate and the color filter substrate. The lower polarizing sheet is arranged on a side of the array substrate away from the liquid crystal layer while the upper polarizing sheet is arranged on a side of the color filter substrate away from the liquid crystal layer. The manufacture process of the liquid crystal displayer is provided as follows: firstly, the array substrate and the color filter substrate are formed; then, the array substrate and the color filter substrate are assembled to form the display panel; and thereafter, the upper and lower polarizing sheets are affixed.

In order to prevent light leakage from edges of the display panel, the upper and lower polarizing sheets have their areas to be greater than that of a display region and are affixed at predetermined locations. Due to technical constraints, referring to FIGS. 1-2, once the upper and lower polarizing sheets are affixed to the display panel, the upper polarizing sheet 01 is apart from edges of a color filter substrate 02 with a certain distance while a lower polarizing sheet 03 is also apart from edges of an array substrate 04 with a certain distance.

Accordingly, degree of accuracy of the affixation should be checked after affixations of the upper polarizing sheet 01 and of the lower polarizing sheet 03. Specifically, an operator manually measures values of a, b in FIG. 1 and c, d in FIG. 2 with a ruler having a precision, to judge whether or not affixations of the upper polarizing sheet 01 and of the lower polarizing sheet 03 conforms to design requirement. However, distances between edges of the upper polarizing sheet 01 and edges of the color filter substrate 02 and edges of the lower polarizing sheet 03 and edges of the array substrate 04 usually are extremely small, accordingly, it is difficult to align and measure by the ruler, resulting in poor measurement accuracy and low effectiveness.

SUMMARY OF THE DISCLOSURE

According to one aspect of the present disclosure, there is provided a liquid crystal display device comprising: a color filter substrate, an array substrate, an upper polarizing sheet arranged at a side of the color filter substrate and a lower polarizing sheet arranged at a side of the array substrate; wherein:

the color filter substrate comprises a first graduated scale and a second graduated scale, the array substrate comprises a third graduated scale and a fourth graduated scale, and the first graduated scale, the second graduated scale, the third graduated scale and the fourth graduated scale are arranged within a non-display region;

the first graduated scale is used to measure a distance of at least one first edge of first edges, which are parallel with each other, of the upper polarizing sheet to an edge of the color filter substrate closer to the at least one first edge; and the second graduated scale is used to measure a distance of at least one second edge of second edges, which are parallel with each other, of the upper polarizing sheet to an edge of the color filter substrate closer to the at least one second edge; and the third graduated scale is used to measure a distance of at least one third edge of third edges, which are parallel with each other, of the lower polarizing sheet to an edge of the array substrate closer to the at least one third edge; and, the fourth graduated scale is used to measure a distance of at least one fourth edge of fourth edges, which are parallel with each other, of the lower polarizing sheet to an edge of the array substrate closer to the at least one fourth edge.

According to another aspect of the present disclosure, there is provided a method for manufacturing a liquid crystal display device, the method comprising steps of: forming and assembling a color filter substrate and an array substrate, forming an upper polarizing sheet at a side of the color filter substrate and forming a lower polarizing sheet arranged at a side of the array substrate; wherein:

the step of forming the color filter substrate comprises forming a color filter substrate including a first graduated scale and a second graduated scale;

the step of forming the array substrate comprises forming an array substrate including a third graduated scale and a fourth graduated scale;

the first graduated scale, the second graduated scale, the third graduated scale and the fourth graduated scale are arranged within a non-display region;

the first graduated scale is used to measure a distance of at least one first edge of first edges, which are parallel with each other, of the upper polarizing sheet to an edge of the color filter substrate closer to the at least one first edge; and the second graduated scale is used to measure a distance of at least one second edge of second edges, which are parallel with each other, of the upper polarizing sheet to an edge of the color filter substrate closer to the at least one second edge; and the third graduated scale is used to measure a distance of at least one third edge of third edges, which are parallel with each other of the lower polarizing sheet to an edge of the array substrate closer to the at least one third edge; and, the fourth graduated scale is used to measure a distance of at least one fourth edge of fourth edges, which are parallel with each other, of the lower polarizing sheet to an edge of the array substrate closer to the at least one fourth edge.

BRIEF DESCRIPTION OF THE DRAWINGS

In order to clearly describe the technical solutions according to the embodiments of the present disclosure or those in the prior arts, drawings used in describing the embodiments will be introduced briefly. Obviously, illustrated in these drawings are only some of embodiments of the present disclosure. For those skilled in the art, other drawings may be achieved by referring to the following drawings without involving any inventive steps.

These and/or other aspects and advantages of the present disclosure will become apparent and more readily appreciated from the following description of the embodiments, taken in conjunction with the accompanying drawings of which.

REFERENCE NUMBERS

01—upper polarizing sheet; 02—color filter substrate; 03—lower polarizing sheet; 04—array substrate; 11—first edge of the upper polarizing sheet; 12—second edge of the upper polarizing sheet; 21—first graduated scale; 22—second graduated scale; 31—third edge of the lower polarizing sheet; 32—fourth edge of the lower polarizing sheet; 41—third graduated scale; 42—fourth graduated scale.

DETAILED DESCRIPTION OF THE EMBODIMENTS OF THE DISCLOSURE

In order to provide a more clear understanding of objects, technique solutions and advantages of the present disclosure, the present disclosure will be further described hereinafter in detail in conjunction with preferred embodiments and with reference to the attached drawings. Obviously, the described embodiments are only some of embodiments of the present disclosure. For those skilled in the art, other embodiments may be achieved by referring to the following embodiments without involving any inventive steps.

Figure 1:
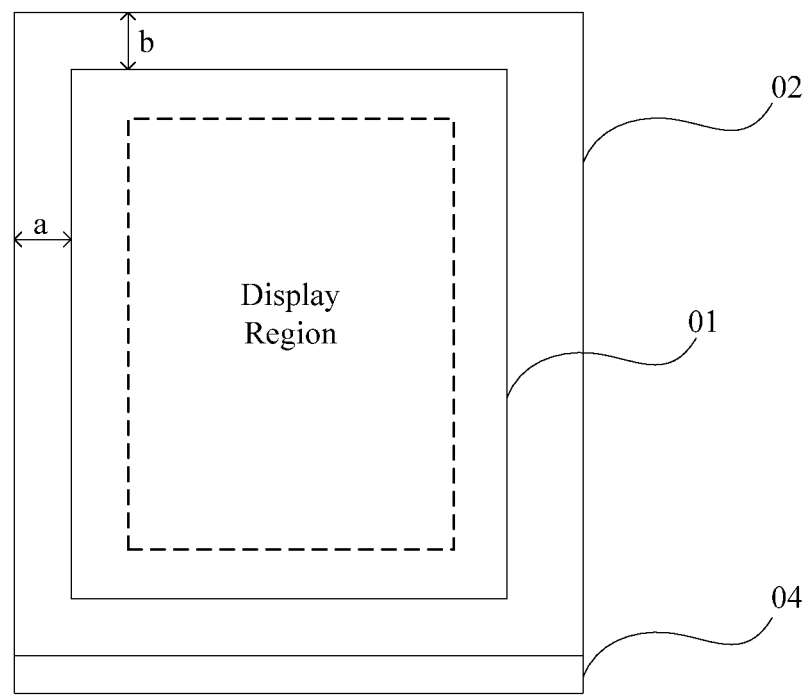
FIG. 1 is a schematic view of affixation of an upper polarizing sheet onto a color filter substrate in the prior arts.
Figure 2:
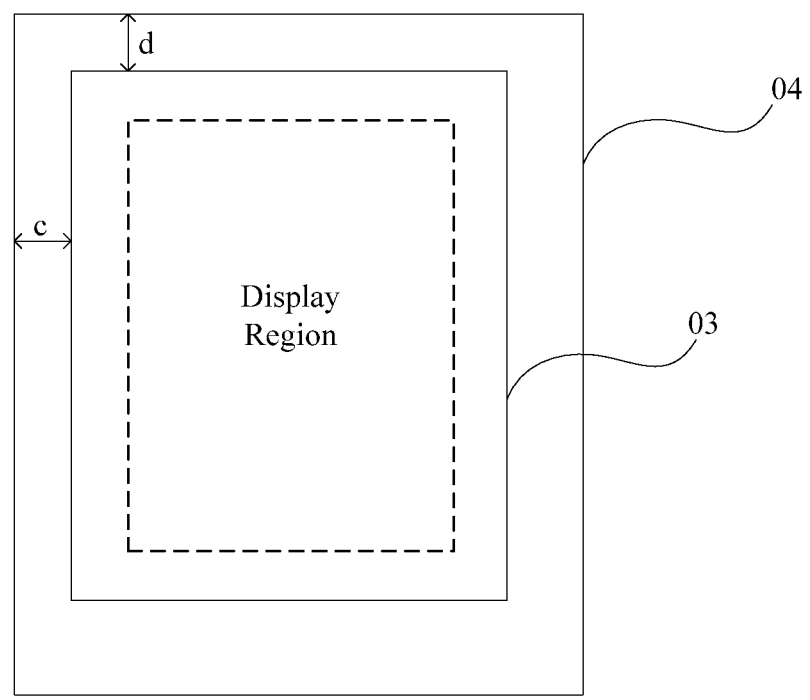
FIG. 2 is a schematic view of affixation of a lower polarizing sheet onto an array substrate in the prior arts.
Figure 3:
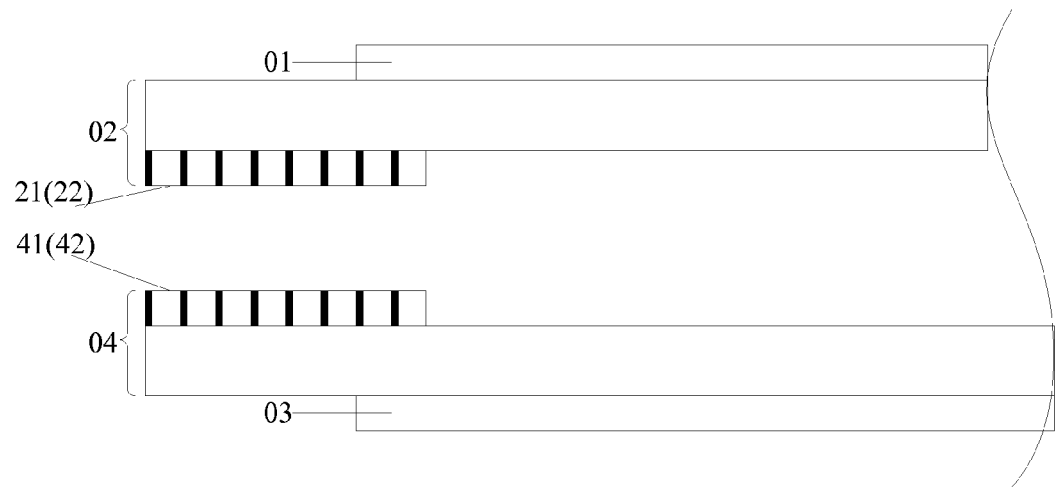
FIG. 3 is a structural schematic view of a liquid crystal display device according to an embodiment of the present disclosure.

There is provided a liquid crystal display device according to these embodiments of the present disclosure. Referring to FIG. 3, the liquid crystal display device comprises: a color filter substrate 02, an array substrate 04, an upper polarizing sheet 01 arranged at a side of the color filter substrate 02 and a lower polarizing sheet 03 arranged at a side of the array substrate 04.

The color filter substrate 02 comprises a first graduated scale 21 and a second graduated scale 22, the array substrate 04 comprises a third graduated scale 41 and a fourth graduated scale 42, and, the first graduated scale 21, the second graduated scale 22, the third graduated scale 41 and the fourth graduated scale 42 are arranged within a non-display region.

The first graduated scale 21 is used to measure a distance of at least one first edge 11 of first edges 11, which are parallel with each other, of the upper polarizing sheet 01 to an edge of the color filter substrate 02 closer to the at least one first edge; and the second graduated scale 22 is used to measure a distance of at least one second edge 12 of second edges 12, which are parallel with each other, of the upper polarizing sheet 01 to an edge of the color filter substrate 02 closer to the at least one second edge 12.

The third graduated scale 41 is used to measure a distance of at least one third edge 31 of third edges 31, which are parallel with each other, of the lower polarizing sheet 03 to an edge of the array substrate 04 closer to the at least one third edge 31; and, the fourth graduated scale 42 is used to measure a distance of at least one fourth edge 32 of fourth edges 32, which are parallel with each other, of the lower polarizing sheet 03 to an edge of the array substrate 04 closer to the at least one fourth edge 32.

Figure 4A:
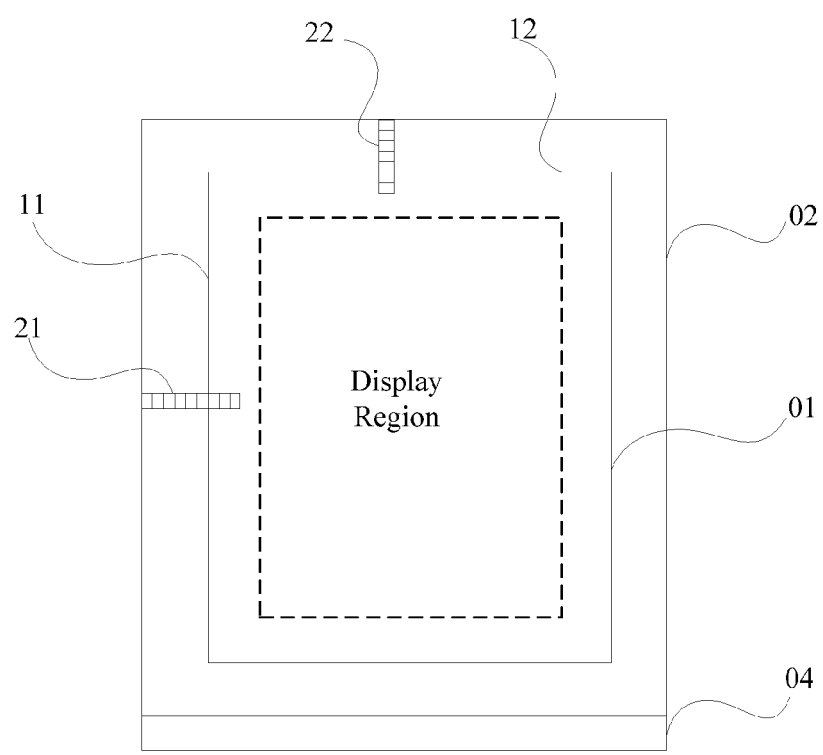
FIG. 4a is a structural schematic view of a color filter substrate according to a first embodiment of the present disclosure.

Specifically, for the color filter substrate 02, the first graduated scale 21 is used to measure a distance of one first edge 11 of the upper polarizing sheet 01 to an edge of the color filter substrate 02 closer to the one first edge 11. That is, as shown in FIG. 4a, the number of the first graduated scale is one, and it is arranged within a portion of the non-display region corresponding to the one first edge 11. In this case, a distance of the other first edge 11 of the upper polarizing sheet 01 to an edge of the color filter substrate 02 closer to the other first edge 11 may be obtained by calculation. That is, if a distance between the two first edges 11, a distance between two edges of the color filter substrate 02 parallel with the two first edges 11 and a distance of one first edge 11 to an edge of the color filter substrate 02 closer to the one first edge 11 are known, then a distance of the other first edge 11 to an edge of the color filter substrate 02 closer to the other first edge 11 may be obtained by calculation.

Figure 4B:
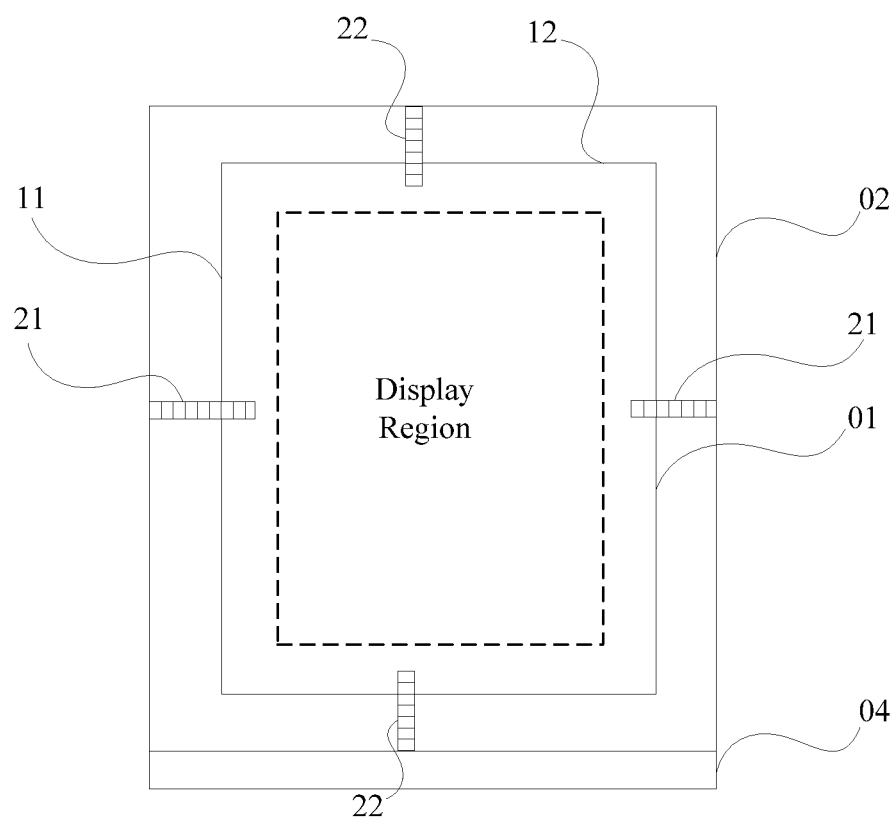
FIG. 4b is a structural schematic view of a color filter substrate according to a second embodiment of the present disclosure.

Of course, the first graduated scale 21 may also be used to measure distances of two first edges 11 of the upper polarizing sheet 01 to edges of the color filter substrate 02 closer to the two first edges 11, respectively. That is, as shown in FIG. 4b, the number of the first graduated scale is two, and they are arranged respectively within portions of the non-display region corresponding to the two first edges 11.

Correspondingly, the second graduated scale 22 is used to measure a distance of one second edge 12 of the upper polarizing sheet 01 to an edge of the color filter substrate 02 closer to the one second edge 12. That is, as shown in FIG. 4a, the number of the second graduated scale is one, and it is arranged within a portion of the non-display region corresponding to the one second edge 12. In this case, a distance of the other second edge 12 to an edge of the color filter substrate 02 closer to the other second edge 12 may be obtained by calculation. That is, if a distance between the two second edge 12, a distance between two edges of the color filter substrate 02 parallel with the two second edges 12 and a distance of one second edge 12 to an edge of the color filter substrate 02 closer to the one second edge 12 are known, then a distance of the other second edge 12 to an edge of the color filter substrate 02 closer to the other second edge 12 may be obtained by calculation.

Of course, the second graduated scale 22 may also be used to measure distances of two second edges 12 of the upper polarizing sheet 01 to edges of the color filter substrate 02 closer to the two second edges 12, respectively. That is, as shown in FIG. 4b, the number of the second graduated scale is two, and they are arranged respectively within portions of the non-display region corresponding to the two second edges 12.

Figure 5A:
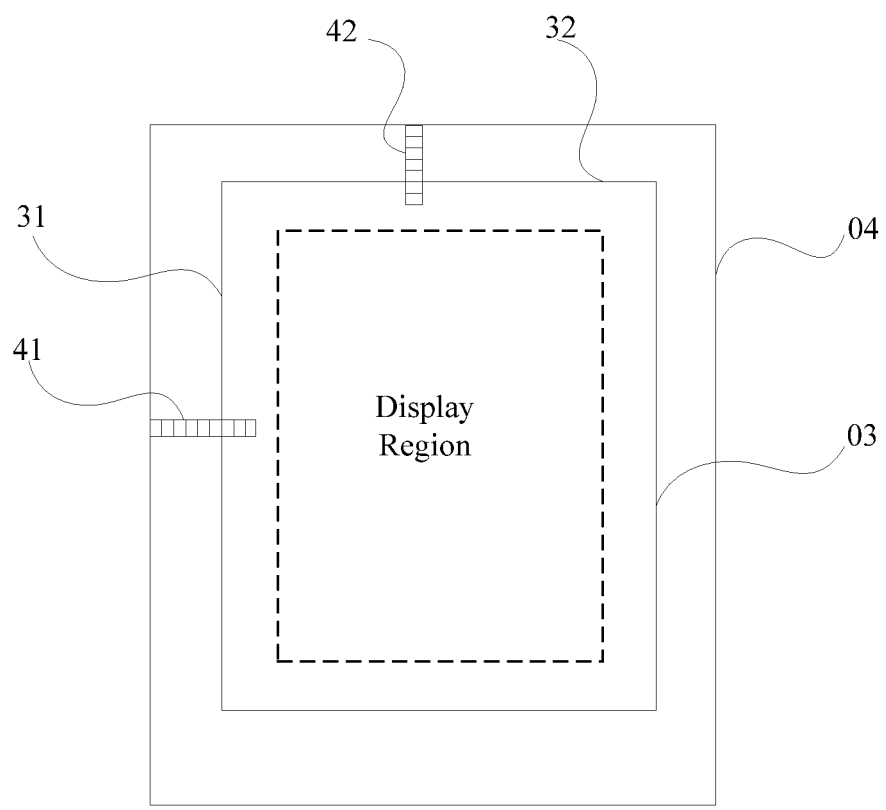
FIG. 5a is a structural schematic view of an array substrate according to a third embodiment of the present disclosure.

For the array substrate 04, the third graduated scale 41 is used to measure a distance of one third edge 31 of the lower polarizing sheet 03 to an edge of the array substrate 04 closer to the one third edge 31. That is, as shown in FIG. 5a, the number of the third graduated scale is one, and it is arranged within a portion of the non-display region corresponding to the one third edges 31. In this case, a distance of the other third edge 31 to an edge of the array substrate 04 closer to the other third edge 31 may be obtained by calculation. That is, if a distance between the two third edges 31, a distance between two edges of the array substrate 04 parallel with the two third edges 31 and a distance of one third edge 31 to an edge of the array substrate 04 closer to the one third edge 31 are known, then a distance of the other third edge 31 to an edge of the array substrate 04 closer to the other third edge 31 may be obtained by calculation.

Figure 5B:
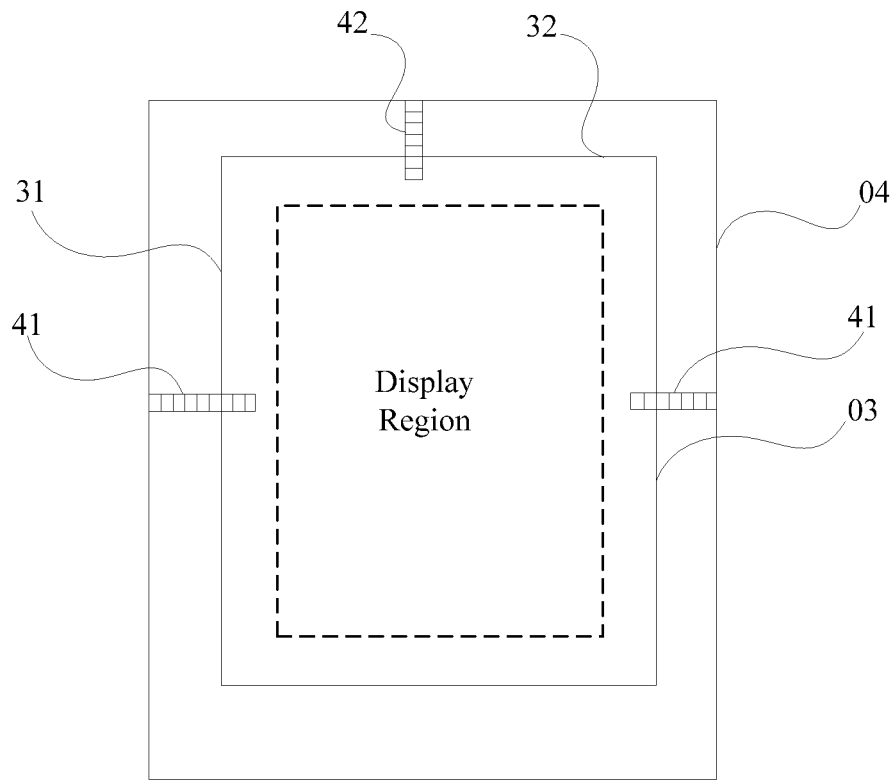
FIG. 5b is a structural schematic view of an array substrate according to a fourth embodiment of the present disclosure.

Of course, the third graduated scale 41 may also be used to measure distances of two third edges 31 of the lower polarizing sheet 03 to edges of the array substrate 04 closer to the two third edges 31, respectively. That is, as shown in FIG. 5b, the number of the third graduated scale is two, and they are arranged respectively within portions of the non-display region corresponding to the two third edges 13.

Correspondingly, the fourth graduated scale 42 is used to measure a distance of one fourth edge 32 of the lower polarizing sheet 03 to an edge of the array substrate 04 closer to the one fourth edge 32. That is, as shown in FIGS. 5a and 5b, the number of the fourth graduated scale is one, and it is arranged within a portion of the non-display region corresponding to the one fourth edge 32. In this case, a distance of the other fourth edge 32 to an edge of the array substrate 04 closer to the other fourth edge 32 may be obtained by calculation. That is, if a distance between the two fourth edges 32, a distance between two edges of the array substrate 04 parallel with the two fourth edges 32 and a distance of one fourth edge 32 to an edge of the array substrate 04 closer to the one fourth edge 32 are known, then a distance of the other fourth edge 32 to an edge of the array substrate 04 closer to the other fourth edge 32 may be obtained by calculation.

Of course, the fourth graduated scale 42 may also be used to measure distances of two fourth edges 32 of the lower polarizing sheet 03 to edges of the array substrate 04 closer to the two fourth edges 32, respectively. That is, the number of the fourth graduated scale 42 is two, and they are arranged respectively within portions of the non-display region corresponding to the two fourth edges 32.

It should be noted that, firstly, according to the abovementioned illustrations and explanations on the graduated scales of the color filter substrate 02 and the array substrate 04, when the color filter substrate 02 and the array substrate 04 are assembled to form a liquid crystal display panel, these configurations of the color filter substrate and these configurations of the array substrate may be combined at will, as long as distances of the respective edges of the upper polarizing sheet 01 to the corresponding edges of the color filter substrate 02 and distances of the respective edges of the lower polarizing sheet 03 to the corresponding edges of the array substrate 04 may be obtained through the graduated scales of the color filter substrate 02 and the array substrate 04.

Secondly, the first graduated scale 21 and the second graduated scale 22 may be arranged in any of layers of the color filter substrate 02, as long as a distance of at least one first edge 11 of the upper polarizing sheet 01 to the edge of the color filter substrate 02 closer to the at least one first edge 11 and a distance of at least one second edge 12 of the upper polarizing sheet 01 to the edge of the color filter substrate 02 closer to the at least one second edge 12 can be obtained.

Likewise, the third graduated scale 41 and the fourth graduated scale 42 may be arranged in any of layers of the array substrate 04, as long as a distance of at least one third edge 31 of the lower polarizing sheet 03 to the edge the array substrate 04 closer to the at least one third edge 31 and a distance of at least one fourth edge 32 of the lower polarizing sheet 03 to the edge of the array substrate 04 closer to the at least one fourth edge 32 can be obtained.

Thirdly, there is no limitation on specifications and graduations of these graduated scales, as long as desirable degree of accuracy of the affixation of the polarizing sheets may be achieved through these graduated scales.

Fourthly, there is no limitation on specific configurations of the color filter substrate 02 and the array substrate 04.

With the liquid crystal display device according to this embodiment of the present disclosure, distances of the respective edges of the upper polarizing sheet 01 to the corresponding edges of the color filter substrate 02 are obtained by directly reading graduation values of the first graduated scale 21 and the second graduated scale 22 on the color filter substrate 02, or by performing a calculation based on the direct reading of graduation values of the first graduated scale 21 and the second graduated scale 22 on the color filter substrate 02, and distances of the respective edges of the lower polarizing sheet 03 to the corresponding edges of the array substrate 04 are achieved by directly reading graduation values of the third graduated scale 41 and the fourth graduated scale 42 on the array substrate 04, or by performing a calculation based on the direct reading of graduation values of the third graduated scale 41 and the fourth graduated scale 42 on the array substrate 04, so that degrees of accuracy of the affixation of the upper polarizing sheet 01 to the color filter substrate 02 and of the affixation of the lower polarizing sheet 03 to the array substrate 04 are obtained. Compared with the conventional method of manually measuring values of degrees of accuracy of the affixation of the polarizing sheets with a ruler, the embodiments of the present disclosure can avoid errors on the manual measurements with the ruler, improving degree of accuracy of the measurements to the affixation of the polarizing sheets.

As mentioned, if a distance of one first edge 11 of the upper polarizing sheet 01 to an edge of the color filter substrate 02 closer to the one first edge 11 is obtained by using one first graduated scale 21 and a distance of one second edge 12 of the upper polarizing sheet 01 to an edge of the color filter substrate 02 closer to the one second edge 12 is obtained by using one second graduated scale 22, a distance of the other first edge 11 of the upper polarizing sheet 01 to an edge of the color filter substrate 02 closer to the other first edge 11 and a distance of the other second edge 12 of the upper polarizing sheet 01 to an edge of the color filter substrate 02 closer to the other second edge 12 may be obtained by calculations. Accordingly, as shown in FIG. 4a, desirably, one first graduated scale 21 and one second graduated scale 22 are arranged on the color filter substrate 02, simplifying the manufacturing process.

Likewise, if a distance of one third edge 31 of the lower polarizing sheet 03 to an edge of the array substrate 04 closer to the one third edge 31 is obtained by using one third graduated scale 41 and a distance of one fourth edge 32 of the lower polarizing sheet 03 to an edge of the array substrate 04 closer to the one fourth edge 32 is obtained by using one fourth graduated scale 42, a distance of the other third edge 31 of the lower polarizing sheet 03 to an edge of the array substrate 04 closer to the other third edge 31 and a distance of the other fourth edge 32 of the lower polarizing sheet 03 to an edge of the array substrate 04 closer to the other fourth edge 32 may be obtained by calculations. Accordingly, as shown in FIG. 5a, desirably, one third graduated scale 41 and one fourth graduated scale 42 are arranged on the array substrate 04, simplifying the manufacturing process.

It should be noted that, since the array substrate 04 is provided with pads, it is desirable to arrange the third graduated scale 41 and the fourth graduated scale 42 in portions of the non-display region where no pads are provided.

Desirably, the first graduated scale 21 and the second graduated scale 22 are arranged in the same layer as a black matrix of the color filter substrate 02. In this way, the first graduated scale 21 and the second graduated scale 22 and the black matrix may be formed by one patterning process, reducing times and the cost of the patterning process.

Desirably, the third graduated scale 41 and the fourth graduated scale 42 are formed in the same layer as a metal layer of the array substrate 04 by one patterning process, and are insulated from the metal layer. In this way, the third graduated scale 41 and the fourth graduated scale 42 and the metal layer may be formed by one patterning process, reducing times and the cost of the patterning process.

The metal layer may be embodied as a gate metal layer including gates, a source-drain metal layer including a source electrode and a drain electrode, or other layers. There is no specific limitation on this.

Desirably, regions where the third graduated scale 41 and the fourth graduated scale 42 are arranged, excepting the third graduated scale 41 and the fourth graduated scale 42, are made of transparent materials.

In this way, only the third graduated scale 41 and the fourth graduated scale 42 are opaque in the regions where they are arranged, which facilitates to read the graduation values and eliminates adverse effect from other metal patterns in the regions, improving degree of accuracy of affixation of the lower polarizing sheet 03.

Desirably, as shown in FIG. 4*a*, in an extending direction of the graduated scale, one rim of the first graduated scale 21 and one rim of the second graduated scale 22 are flush with edges of the color filter substrate 02; and as shown in FIG. 5*a*, in an extending direction of the graduated scale, one rim of the third graduated scale 41 and one rim of the fourth graduated scale 42 are flush with edges of the array substrate 04. In this way, the manufacturing process of the graduated scales is simplified, correspondences between the graduations of the graduated scales and corresponding edges of the color filter substrate 02 and the array substrate 04 are ensured.

Desirably, central graduations of the first graduated scale 21, the second graduated scale 22, the third graduated scale 23 and the fourth graduated scale 24 are located at middle positions of these graduated scales, respectively.

The central graduation of the first graduated scale 21 is superposed with a predetermined position of the first edge 11, the central graduation of the second graduated scale 22 is superposed with a predetermined position of the second edge 12, the central graduation of the third graduated scale 41 is superposed with a predetermined position of the third edge 31, and, the central graduation of the fourth graduated scale 42 is superposed with a predetermined position of the fourth edge 22.

It should be noted that, taking the first graduated scale 21 as an example, the central graduation of the first graduated scale 21 is located at the middle position of this first graduated scale 21. That is, as shown in FIG. 6, an initial graduation '0' of the first graduated scale 21 is located at the middle position of this first graduated scale 21, and the rest of graduations are gradually and symmetrically increased in the opposing directions started from the initial graduation '0'.

Moreover, taking the first graduated scale 21 as an example, the central graduation of the first graduated scale 21 is superposed with a predetermined position of the first edge 11, which facilitates to read intuitively value of amount of deviation from the predetermined position after affixing the upper polarizing sheet 01.

Figure 6:
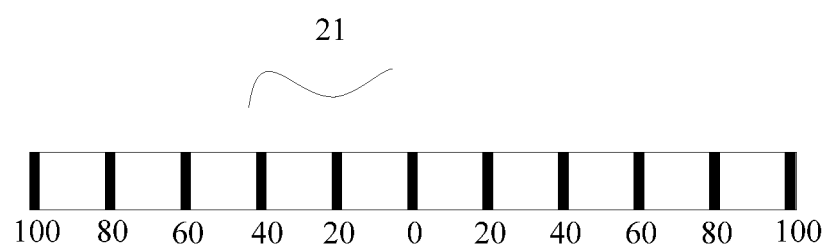
FIG. 6 is a schematic view of a first graduated scale according to an embodiment of the present disclosure.

FIG. 6 only schematically shows some of the graduations of these graduated scales, and the graduations may be changed in accordance with practical requirements.

Desirably, lengths of the first graduated scale 21, the second graduated scale 22, the third graduated scale 41 and the fourth graduated scale 42 are 100~400 μm.

The lengths of the first graduated scale 21, the second graduated scale 22, the third graduated scale 41 and the fourth graduated scale 42 may be the same one another, or may be different from one another. No limitation is provided on this.

Accuracy of the respective graduated scales may be decided in accordance with practical requirements. For example, it may be 20 μm~50 μm.

Practically, since distances of the upper polarizing sheet 01 to an edge of the color filter substrate 02 and of the lower polarizing sheet 03 to an edge of the array substrate 04 are usually less than 200 μm, it is desirable to measuring affixation accuracy of the polarizing sheets by using the graduated scale having a length of 200 μm and a graduation accuracy of 20 μm.

There is also provided a method for manufacturing a liquid crystal display device according to an embodiment of the present disclosure. The method comprises steps of: forming and assembling a color filter substrate 02 and an array substrate 04, forming an upper polarizing sheet 01 at a side of the color filter substrate 02 and forming a lower polarizing sheet 03 at a side of the array substrate 04. Step of forming the color filter substrate 02 comprises forming a color filter substrate 02 including a first graduated scale 21 and a second graduated scale 22. Step of forming the array substrate 04 comprises forming an array substrate 04 including a third graduated scale 41 and a fourth graduated scale 42.

The first graduated scale 21, the second graduated scale 22, the third graduated scale 41 and the fourth graduated scale 42 are arranged within a non-display region.

The first graduated scale 21 is used to measure a distance of at least one first edge 11 of first edges 11, which are parallel with each other, of the upper polarizing sheet 01 to an edge of the color filter substrate 02 closer to the at least one first edge 11; and the second graduated scale 22 is used to measure a distance of at least one second edge 12 of second edges 12, which are parallel with each other, of the upper polarizing sheet 01 to an edge of the color filter substrate 02 closer to the at least one second edge 12.

The third graduated scale 41 is used to measure a distance of at least one third edge 31 of third edges 31, which are parallel with each other, of the lower polarizing sheet 03 to an edge of the array substrate 04 closer to the at least one third edge 31; and, the fourth graduated scale 42 is used to measure a distance of at least one fourth edge 32 of fourth edges 32, which are parallel with each other, of the lower polarizing sheet 03 to an edge of the array substrate 04 closer to the at least one fourth edge 32.

Specifically, for the color filter substrate 02, as shown in FIG. 4*a*, the number of the first graduated scale 21 is one, and it is arranged within a portion of the non-display region corresponding to the one first edge 11. In this case, a distance of the other first edge 11 of the upper polarizing sheet 01 to an edge of the color filter substrate 02 closer to the other first edge 11 may be obtained by calculation.

As shown in FIG. 4*b*, the number of the first graduated scale 21 may be two, and they are arranged within portions of the non-display region corresponding to the respective first edges 11.

As shown in FIG. 4*a*, the number of the second graduated scale 22 is one, and it is arranged within a portion of the non-display region corresponding to the one second edge 12. In this case, a distance of the other second edge 12 to an edge of the color filter substrate 02 closer to the other second edge 12 may be obtained by calculation.

As shown in FIG. 4b, the number of the second graduated scale 22 may be two, and they are arranged within portions of the non-display region corresponding to the respective second edges 12.

For the array substrate 04, as shown in FIG. 5a, the number of the third graduated scale 41 is one, and it is arranged within a portion of the non-display region corresponding to the one third edges 13. In this case, a distance of the other third edge 13 to an edge of the array substrate 04 closer to the other third edge 13 may be obtained by calculation.

As shown in FIG. 5b, the number of the third graduated scale 41 may be two, and they are arranged within portions of the non-display region corresponding to the respective third edges 31.

As shown in FIG. 5a, the number of the fourth graduated scale 42 is one, and it is arranged within a portion of the non-display region corresponding to the one fourth edge 32. In this case, a distance of the other fourth edge 32 to an edge of the array substrate 04 closer to the other fourth edge 32 may be obtained by calculation.

Of course, the number of the fourth graduated scale 42 may be two, and they are arranged within portions of the non-display region corresponding to the respective fourth edges 32.

It should be noted that, firstly, according to the abovementioned illustrations and explanations on the graduated scales of the color filter substrate 02 and the array substrate 04, when the color filter substrate 02 and the array substrate 04 are assembled to form a liquid crystal display panel, these configurations of the color filter substrate and these configurations of the array substrate may be combined at will, as long as distances of the respective edges of the upper polarizing sheet 01 to the corresponding edges of the color filter substrate 02 and distances of the respective edges of the lower polarizing sheet 03 to the corresponding edges of the array substrate 04 may be obtained through the graduated scales of the color filter substrate 02 and the array substrate 04.

Secondly, the first graduated scale 21 and the second graduated scale 22 may be arranged in any of layers of the color filter substrate 02, as long as a distance of at least one first edge 11 of the upper polarizing sheet 01 to the edge of the color filter substrate 02 closer to the at least one first edge 11 and a distance of at least one second edge 12 of the upper polarizing sheet 01 to the edge of the color filter substrate 02 closer to the at least one second edge 12 can be obtained.

Likewise, the third graduated scale 41 and the fourth graduated scale 42 may be arranged in any of layers of the array substrate 04, as long as a distance of at least one third edge 31 of the lower polarizing sheet 03 to the edge the array substrate 04 closer to the at least one third edge 31 and a distance of at least one fourth edge 32 of the lower polarizing sheet 03 to the edge of the array substrate 04 closer to the at least one fourth edge 32 can be obtained.

Thirdly, there is no limitation on specifications and graduations of these graduated scales, as long as desirable degree of accuracy of the affixation of the polarizing sheets may be achieved through these graduated scales.

Fourthly, there is no limitation on sequences of forming pattern layers of the color filter substrate 02 and the array substrate 04 except the graduated scales.

With the method for manufacturing a liquid crystal display device according to this embodiment of the present disclosure, distances of the respective edges of the upper polarizing sheet 01 to the corresponding edges of the color filter substrate 02 are obtained by directly reading graduation values of the first graduated scale 21 and the second graduated scale 22 formed on the color filter substrate 02, or by performing a calculation based on the direct reading of graduation values of the first graduated scale 21 and the second graduated scale 22 arranged on the color filter substrate 02, and distances of the respective edges of the lower polarizing sheet 03 to the corresponding edges of the array substrate 04 are achieved by directly reading graduation values of the third graduated scale 41 and the fourth graduated scale 42 on the array substrate 04, or by performing a calculation based on the direct reading of graduation values of the third graduated scale 41 and the fourth graduated scale 42 on the array substrate 04, so that degrees of accuracy of the affixation of the upper polarizing sheet 01 to the color filter substrate 02 and of the affixation of the lower polarizing sheet 03 to the array substrate 04 are obtained. Compared with the conventional method of manually measuring values of degrees of accuracy of the affixation of the polarizing sheets with a ruler, the embodiments of the present disclosure can avoid errors on the manual measurements with the ruler, improving degree of accuracy of the measurements to the affixation of the polarizing sheets.

As shown in FIG. 4a, for the color filter substrate 02, it is desirable to form one first graduated scale 21 and one second graduated scale 22 on this color filter substrate 02.

As shown in FIG. 5a, for the array substrate 04, it is desirable to form one third graduated scale 41 and one fourth graduated scale 42 on this array substrate 04.

In this way, the manufacturing process is simplified.

It should be noted that, since the array substrate 04 is provided with pads, it is desirable to arrange the third graduated scale 41 and the fourth graduated scale 42 in portions of the non-display region where no pads are provided.

In order to reduce times of the patterning process, it is desirable to form the first graduated scale 21 and the second graduated scale 22 and the black matrix of the color filter substrate 02 by one patterning process. It is desirable to form the third graduated scale 41 and the fourth graduated scale 42 together with a metal electrode of the array substrate 04 by one patterning process, while insulating the third graduated scale 41 and the fourth graduated scale 42 from the metal electrode.

The metal electrode may be embodied as gates, a source electrode and a drain electrode, or the like. There is no specific limitation on this.

Desirably, regions where the third graduated scale 41 and the fourth graduated scale 42 are arranged, excepting the third graduated scale 41 and the fourth graduated scale 42, are made of transparent materials.

In this way, only the third graduated scale 41 and the fourth graduated scale 42 in the regions where they are located are opaque, which facilitates to read the graduation values and eliminates adverse effect from other metal patterns in the regions, improving degree of accuracy of affixation of the lower polarizing sheet 03.

Desirably, as shown in FIG. 4a, in an extending direction of the graduated scale, one rim of the first graduated scale 21 and one rim of the second graduated scale 22 are flush with edges of an underlying substrate of the color filter substrate 02; and as shown in FIG. 5a, in an extending direction of the graduated scale, one rim of the third graduated scale 41 and one rim of the fourth graduated scale 42 are flush with edges of an underlying substrate of the array substrate 04.

In this way, the manufacturing process of the graduated scales is simplified, and correspondences between the graduations of the graduated scales and corresponding edges of the color filter substrate 02 and the array substrate 04 are ensured.

Further, desirably, central graduations of the first graduated scale 21, the second graduated scale 22, the third graduated scale 23 and the fourth graduated scale 24 are located at middle positions of these graduated scales, respectively. The central graduation of the first graduated scale 21 is superposed with a predetermined position of the first edge 11, the central graduation of the second graduated scale 22 is superposed with a predetermined position of the second edge 12, the central graduation of the third graduated scale 41 is superposed with a predetermined position of the third edge 31, and, the central graduation of the fourth graduated scale 42 is superposed with a predetermined position of the fourth edge 22.

It should be noted that, taking the first graduated scale 21 as an example, the central graduation of the first graduated scale 21 is located at the middle position of this first graduated scale 21. That is, as shown in FIG. 6, an initial graduation '0' of the first graduated scale 21 is located at the middle position of this first graduated scale 21, and the rest of graduations are gradually and symmetrically increased in the opposing directions started from the initial graduation '0'.

FIG. 6 only schematically shows some of the graduations of these graduated scales, and the graduations may be changed in accordance with practical requirements.

Desirably, lengths of the first graduated scale 21, the second graduated scale 22, the third graduated scale 41 and the fourth graduated scale 42 are 100~400 μm.

The lengths of the first graduated scale 21, the second graduated scale 22, the third graduated scale 41 and the fourth graduated scale 42 may be the same one another, or may be different from one another. No limitation is provided on this.

Accuracy of the respective graduated scales may be decided in accordance with practical requirements. For example, it may be 20 μm~50 μm.

Practically, since distances of the upper polarizing sheet 01 to an edge of the color filter substrate 02 and of the lower polarizing sheet 03 to an edge of the array substrate 04 are usually less than 200 μm, it is desirable to measuring affixation accuracy of the polarizing sheets by using the graduated scale having a length of 200 μm and a graduation accuracy of 20 μm.

Purposes, technical solutions and advantageous effects of the present disclosure have been further illustrated in the above specific embodiments. It should be understood that the above description is merely used to illustrate specific embodiments of the present disclosure, but not to limit the present disclosure. All of changes, equivalent alternatives, improvements, made within principles and spirit of the disclosure, should be included within the scope of the present disclosure, and the scope of which is defined in the claims and their equivalents.

What is claimed is:

1. A liquid crystal display device, comprising: a color filter substrate, an array substrate, an upper polarizing sheet arranged at a side of the color filter substrate and a lower polarizing sheet arranged at a side of the array substrate; wherein:
the color filter substrate comprises a first graduated scale and a second graduated scale, the array substrate comprises a third graduated scale and a fourth graduated scale, and the first graduated scale, the second graduated scale, the third graduated scale and the fourth graduated scale are arranged within a non-display region;
the first graduated scale is configured to measure a distance of at least one first edge of a plurality of first edges, which are parallel with each other, of the upper polarizing sheet to an edge of the color filter substrate closer to the at least one first edge; and the second graduated scale is configured to measure a distance of at least one second edge of a plurality of second edges, which are parallel with each other, of the upper polarizing sheet to an edge of the color filter substrate closer to the at least one second edge; and
the third graduated scale is configured to measure a distance of at least one third edge of a plurality of third edges, which are parallel with each other, of the lower polarizing sheet to an edge of the array substrate closer to the at least one third edge; and, the fourth graduated scale is configured to measure a distance of at least one fourth edge of a plurality of fourth edges, which are parallel with each other, of the lower polarizing sheet to an edge of the array substrate closer to the at least one fourth edge.

2. The liquid crystal display device of claim 1, wherein a number of the first graduated scale is one and a number of the second graduated scale is one.

3. The liquid crystal display device of claim 1, wherein a number of the third graduated scale is one and a number of the fourth graduated scale is one.

4. The liquid crystal display device of claim 1, wherein the first graduated scale and the second graduated scale are arranged in the same layer as a black matrix of the color filter substrate.

5. The liquid crystal display device of claim 1, wherein the third graduated scale and the fourth graduated scale are arranged in the same layer as, and are insulated from, a metal layer of the array substrate.

6. The liquid crystal display device of claim 5, wherein regions where the third graduated scale and the fourth graduated scale are arranged, excepting the third graduated scale and the fourth graduated scale, are made of transparent material.

7. The liquid crystal display device of claim 1, wherein, in an extending direction of the first and second graduated scales, one rim of the first graduated scale and one rim of the second graduated scale are flush with the edges of the color filter substrate respectively; and
in an extending direction of the third and fourth graduated scales, one rim of the third graduated scale and one rim of the fourth graduated scale are flush with the edges of the array substrate respectively.

8. The liquid crystal display device of claim 7, wherein, central graduations of the first graduated scale, the second graduated scale, the third graduated scale and the fourth graduated scale are located at middle positions of these graduated scales, respectively; and
the central graduation of the first graduated scale is superposed with a predetermined position of the first edge, the central graduation of the second graduated scale is superposed with a predetermined position of the second edge, the central graduation of the third graduated scale is superposed with a predetermined position of the third edge, and, the central graduation of the fourth graduated scale is superposed with a predetermined position of the fourth edge.

9. The liquid crystal display device of claim 8, wherein, lengths of the first graduated scale, the second graduated scale, the third graduated scale and the fourth graduated scale are 100~400 μm.

10. A method for manufacturing a liquid crystal display device, the method comprising steps of: forming and assembling a color filter substrate and an array substrate, forming an upper polarizing sheet at a side of the color filter substrate and forming a lower polarizing sheet at a side of the array substrate; wherein:

the step of forming the color filter substrate comprises forming a color filter substrate including a first graduated scale and a second graduated scale;

the step of forming the array substrate comprises forming an array substrate including a third graduated scale and a fourth graduated scale;

the first graduated scale, the second graduated scale, the third graduated scale and the fourth graduated scale are arranged within a non-display region;

the first graduated scale is configured to measure a distance of at least one first edge of a plurality of first edges, which are parallel with each other, of the upper polarizing sheet to an edge of the color filter substrate closer to the at least one first edge; and the second graduated scale is configured to measure a distance of at least one second edge of a plurality of second edges, which are parallel with each other, of the upper polarizing sheet to an edge of the color filter substrate closer to the at least one second edge; and the third graduated scale is configured to measure a distance of at least one third edge of a plurality of third edges, which are parallel with each other, of the lower polarizing sheet to an edge of the array substrate closer to the at least one third edge; and, the fourth graduated scale is configured to measure a distance of at least one fourth edge of a plurality of fourth edges, which are parallel with each other, of the lower polarizing sheet to an edge of the array substrate closer to the at least one fourth edge.

11. The method of claim 10, wherein a number of the first graduated scale is one and a number of the second graduated scale is one.

12. The method of claim 10, wherein a number of the third graduated scale is one and a number of the fourth graduated scale is one.

13. The method of claim 10, wherein the first graduated scale and the second graduated scale are formed together with a black matrix of the color filter substrate, by one patterning process.

14. The method of claim 10, wherein the third graduated scale and the fourth graduated scale are formed together with a metal electrode of the array substrate, by one patterning process, and are insulated from the metal electrode.

15. The method of claim 14, wherein regions where the third graduated scale and the fourth graduated scale are arranged, excepting the third graduated scale and the fourth graduated scale, are made of transparent material.

16. The method of claim 10, wherein, in an extending direction of the first and second graduated scales, one rim of the first graduated scale and one rim of the second graduated scale are flush with the edges of the color filter substrate respectively; and in an extending direction of the third and fourth graduated scales, one rim of the third graduated scale and one rim of the fourth graduated scale are flush with the edges of the array substrate respectively.

17. The method of claim 16, wherein, central graduations of the first graduated scale, the second graduated scale, the third graduated scale and the fourth graduated scale are located at middle positions of these graduated scales, respectively; and the central graduation of the first graduated scale is superposed with a predetermined position of the first edge, the central graduation of the second graduated scale is superposed with a predetermined position of the second edge, the central graduation of the third graduated scale is superposed with a predetermined position of the third edge, and, the central graduation of the fourth graduated scale is superposed with a predetermined position of the fourth edge.

18. The method of claim 17, wherein, lengths of the first graduated scale, the second graduated scale, the third graduated scale and the fourth graduated scale are 100~400 μm.

* * * * *